United States Patent [19]  
Nishimura

[11] Patent Number: 4,836,209  
[45] Date of Patent: Jun. 6, 1989

[54] NMR IMAGING OF MOVING MATERIAL USING VARIABLE SPATIALLY SELECTED EXCITATION

[75] Inventor: Dwight G. Nishimura, Palo Alto, Calif.

[73] Assignee: Stanford University, Stanford, Calif.

[21] Appl. No.: 193,212

[22] Filed: May 11, 1988

Related U.S. Application Data

[63] Continuation of Ser. No. 894,319, Aug. 7, 1986, abandoned.

[51] Int. Cl.⁴ ............................................... A61B 5/05
[52] U.S. Cl. ................................... 128/653; 324/306; 324/309
[58] Field of Search .................. 128/653; 324/306, 309

[56] References Cited

U.S. PATENT DOCUMENTS

| | | | |
|---|---|---|---|
| 4,516,582 | 5/1985 | Redington | 128/653 |
| 4,528,985 | 7/1985 | Macovski | 324/309 |
| 4,532,473 | 7/1985 | Wehrli | 324/306 |
| 4,616,180 | 10/1986 | Compton | 324/309 |

*Primary Examiner*—Ruth S. Smith  
*Attorney, Agent, or Firm*—Flehr, Hohbach, Test, Albritton & Herbert

[57] ABSTRACT

A method of imaging material flowing through a slab in a body using magnetic resonance techniques includes placing the body in a magnetic field including a first magnetic (z) gradient for slab thickness selection. A first rf pulse (180°) is applied to the body at a frequency band and of sufficient strength to flip nuclear spins located essentially in the slab. After allowing moving material in the slab to flow from the slab, a second rf (90°) pulse is applied to the body at a frequency band of sufficient strength to flip the nuclear spins in the slab for generating a signal. First image date in an X-Z plane is obtained from the nuclear spins flipped by the second 90° rf pulse. Thereafter, a third 180° rf pulse is applied to the body. In one embodiment the third rf pulse is non-selective and is of sufficient strength to flip nuclear spins in the body including but not limited to the slab. Moving material is again allowed to flow from the slab, and a fourth 90° rf pulse is then applied to the body at a frequency band and of sufficient strength to flip nuclear spins in the slab. Second image data in an X-Z plane is obtained from nuclear spins flipped by the fourth 90° rf pulse. The first image data is subtracted from the second image data to obtain third image data of moving material through the slab. Alternatively, the first image data and the second image data can be gated to different portions of a cardiac cycle whereby the flow of moving material differs in obtaining the first image data from the flow of moving material in obtaining the second image data. Direction sensitivity can be obtained by selective spatial excitation of portions of the body.

10 Claims, 3 Drawing Sheets

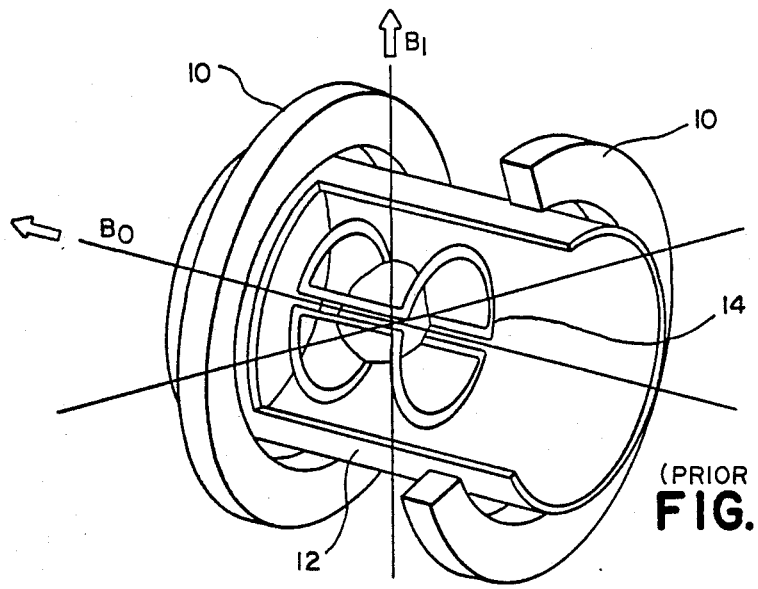
(PRIOR ART)
FIG.—1A
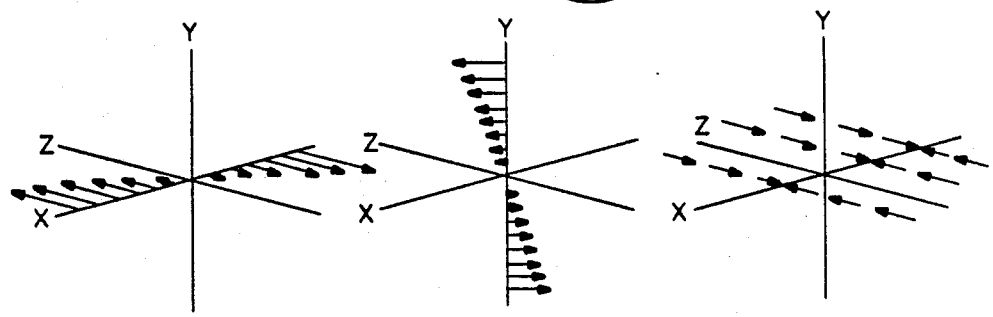
FIG.—1B  FIG.—1C  FIG.—1D
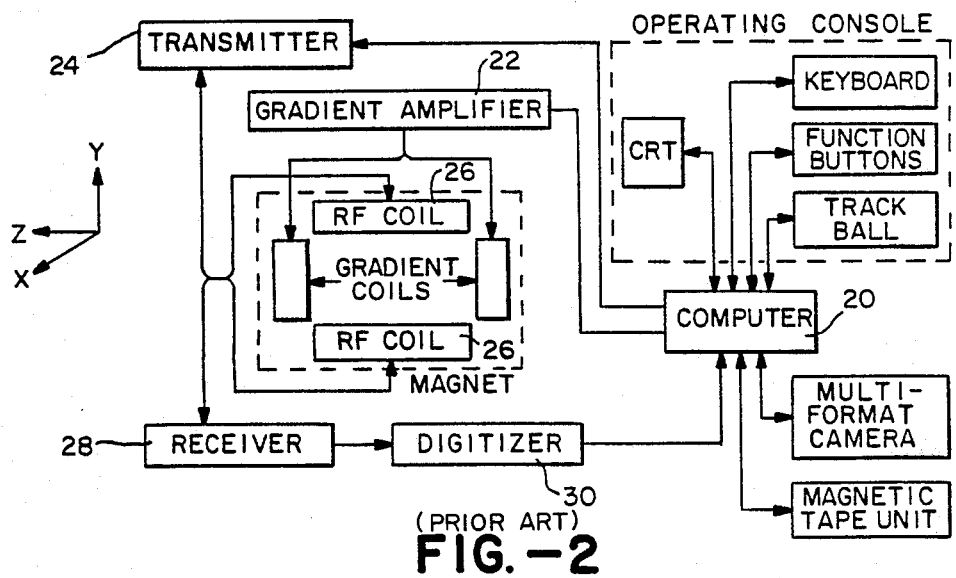
(PRIOR ART)
FIG.—2

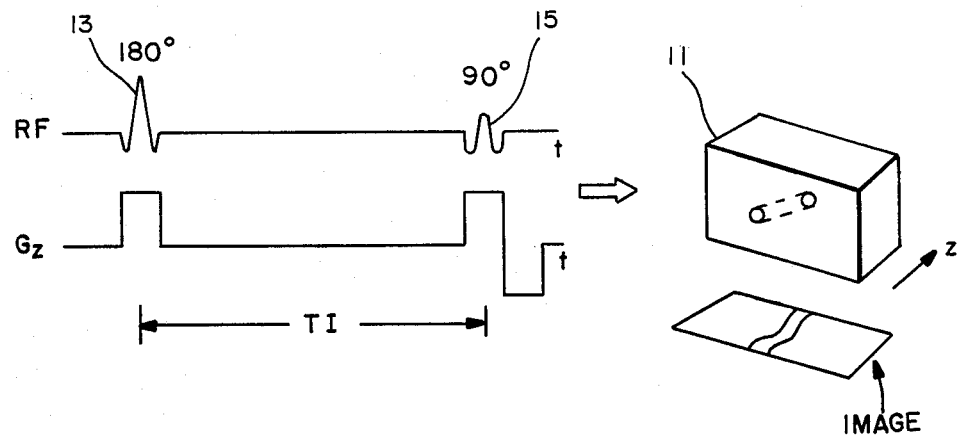
FIG.—3
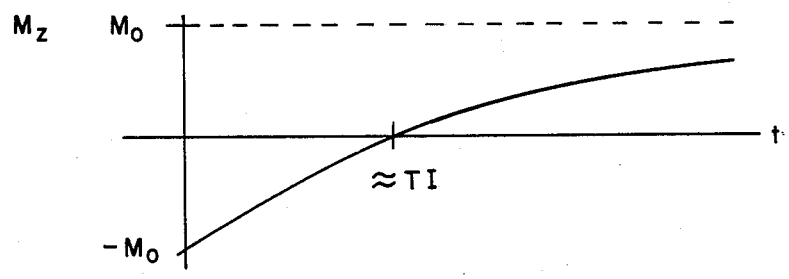
FIG.—4

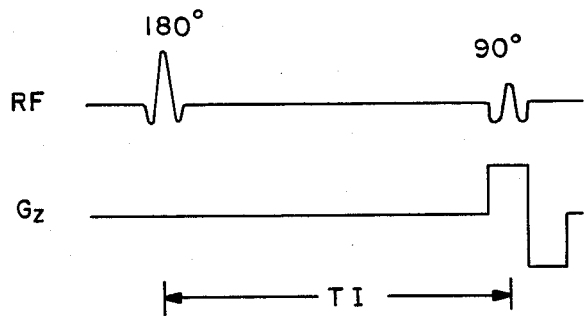
FIG.—5
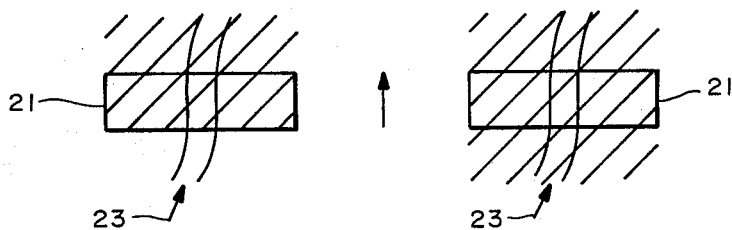
FIG.—6A    FIG.—6B
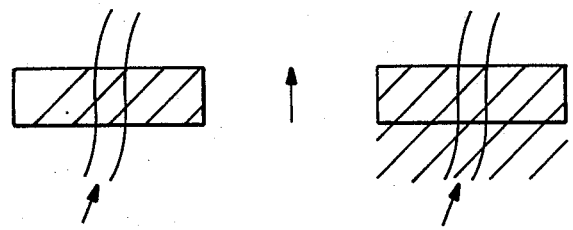
FIG.—7A    FIG.—7B

NMR IMAGING OF MOVING MATERIAL USING VARIABLE SPATIALLY SELECTED EXCITATION

This is a continuation of application Ser. No. 894,319 filed Aug. 7, 1986, abondoned.

BACKGROUND OF THE INVENTION

This invention relates generally to nuclear magnetic resonance (NMR) or magnetic resonance (MR) imaging, and more particularly the invention relates to the selective projection imaging of moving material by magnetic gradient manipulation.

Techniques are known for magnetic resonance angiography in which blood flow is imaged. U.S. Pat. No. 4,528,985 utilizes a temporal subtraction technique in which image data at two different time intervals is obtained and subtracted so that data for static material cancels and data for moving material (e.g., blood) provides a residual image.

U.S. Pat. No. 4,516,582 excites nuclear spins in a thin slab and employs a gradient field to dephase excited spins of static material. After a time interval in which excited nuclear spins of blood flow from the thin slab, the nuclear spins and the slabs are again excited. Due to the dephasing to the static spins, substantially all of the subsequent resulting NMR signal will come from the excitation of spins of blood flow which moves into the slab during the time interval.

U.S. Pat. No. 4,647,857 for FLOW MEASUREMENT USING NUCLEAR MAGNETIC RESONANCE utilizes spin echo techniques to eliminate the effects of static nuclear spins whereby a residual signal from dynamic or moving nuclear spins is obtained.

Disclosed in copending application Ser. No. 894,318, filed Aug. 7, 1986, now U.S. Pat. No. 4,718,424 is a method of imaging blood flow utilizing the selective effects of magnetic gradient field waveform moments on static material and on flowing material. By varying the polarity and duration of a magnetic field gradient in which material is positioned, the magnitude or phase of nuclear spins signals and FIDs can be varied depending on the motion of the material in a direction aligned with the magnetic field gradient.

SUMMARY OF THE INVENTION

An object of the invention is a method of and apparatus for imaging moving material using variably spatially selected excitations.

Another object of the an invention is an improved method of subtraction angiography.

A feature of the invention is the use of a first excitation pulse, 180° for example, for inverting nuclear spins in a slab. After a period of time during which flowing material from outside the slab flows into the slab, a second excitation pulse, 90° for example, is applied for generating a first image signal from the flowing material in the slab. Thereafter, the excitation sequence is repeated for the slab and for at least one adjacent region including material flowing into the slab to obtain a second image signal. The second image signal is subtracted from the first image signal to remove any residual signal from static material thereby obtaining a difference signal corresponding to flowing material. The necessary data acquisition is performed on the generated signal along the thickness axis of the slab to form a two dimensional (2-d) image of the volume using spin warp imaging or other methods such as echo planar or generalized imaging with time variant gradients.

Since static material has different $T_1$ values in general, static material signals may remain in the generated image signals. To the extent that these remaining signals dominate the blood signals, they are eliminated by subtracting the signals. This is readily accomplished in accordance with the invention by acquiring the second image signal with the same static material component as in the first image but a different signal component from blood.

The invention and objects and features thereof will be more readily apparent from the following detailed description and appended claims when taken with the drawing.

DESCRIPTION OF THE DRAWINGS

FIGS. 1A-1D illustrate the arrangement of NMR apparatus and magnetic fields generated therein.

FIG. 2 is a functional block diagram of NMR imaging apparatus.

FIG. 3 illustrates a basic pulse sequence for exciting a slab and the resultant projection image for use in accordance with one embodiment of the invention.

FIG. 4 is a plot illustrating longitudinal relaxation with time after inversion using the pulse sequence of FIG. 3.

FIG. 5 is an illustration of a pulse sequence for obtaining a second image for subtraction imaging in accordance with the invention.

FIGS. 6A and 6B illustrate top views of slabs and adjoining regions with the shaded regions indicating regions excited by 180° pulses in accordance with one embodiment of the invention for obtaining two image signals.

FIGS. 7A and 7B are top views of slabs and adjoining regions with the shaded portions indicating regions excited by 180° pulses in accordance with another embodiment of the invention for obtaining two image signals.

DETAILED DESCRIPTION OF ILLUSTRATED EMBODIMENTS

Referring now to the drawings, FIG. 1A is a perspective view partially in section illustrating coil apparatus in NMR imaging system, and FIGS. 1B-1D illustrate field gradients which can be produced in the apparatus of FIG. 1A. This apparatus is discussed by Hinshaw and Lent, "An Introduction to NMR Imaging: From the Bloch Equation to the Imaging Equation", *Proceedings of the IEEE*, Vol. 71, No. 3, March 1983 pgs. 338–350. Briefly, the uniform static field $B_o$ is generated by the magnet comprising the coil pair 10. A gradient field G(x) is generated by a complex gradient coil set which can be wound on the cylinder 12. An RF field $B_1$ is generated by a saddle coil 14. A patient undergoing imaging would be positioned along the z axis within the saddle coil 14.

In FIG. 1B an X gradient field is shown which is parallel to the static field $B_o$ and varies linearly with distance along the X axis but does not vary with distance along the Y or Z axes. FIGS. 1C and 1D are similar representations of the Y gradient and Z gradient fields, respectively.

FIG. 2 is a functional block diagram of the imaging apparatus as disclosed in *NMR-A Perspective on Imaging*, General Electric Company 1982. A computer 20 is programmed to control the operation of the NMR apparatus and process FID signals detected therefrom. The gradient field is energized by a gradient amplifier 22, and the RF coils for impressing a RF magnetic moment at the Larmor frequency is controlled by the transmitter 24 and the RF coils 26. After the selected nuclei have been flipped, the RF coils 26 are employed to detect the FID signal which is passed to the receiver 28 and thence through digitizer 30 for processing by computer 20.

In accordance with the present invention, moving material such as blood flow is imaged by means of a variably spatially selective excitation. The invention uses time of flight effects to distinguish signals of flowing blood from signals of static material. The basic procedure is illustrated in FIG. 3 and includes the following steps:

1. Selectively excite a slab 11 (perpendicular to the Z axis, for example) with an inverting pulse 13 (180° or other large flip angle). This represents a preparatory pulse.
2. Wait TI seconds. This is the evolution period.
3. Selectively excite the same slab 11 with a pulse 15 or pulse suitable for generating a signal (for example 90° or a 90°-180° combination for spin echo). The RF pulses are applied in the presence of a Z gradient, $G_Z$, as illustrated.
4. With the generated FID signal, the necessary data acquisition is performed to form a two dimension (X-Z) image of the volume using spin warp imaging or other methods such as echo planar or generalized imaging with time varying gradients.

The image resulting from the above procedure will contain a relatively large signal from blood if flow is predominantly in the Z direction. After the 180° pulse, there occurs an inflow of fresh, unexcited nuclear spins from blood into the slab by the time the 90° pulse is applied to generate the signal. The extent of flow over TI seconds is approximately equal to the average Z velocity, $V_Z$, times TI, and this value determines the usual thickness of the excited slab. For example, if $V_Z$ equal 20 cm/second and TI equal 400 msec, then the excited slab should be about 8 cm thick. If static material has a known and relatively uniform $T_1$ longitudinal relaxation time constant, then TI can be selected so that the 90° pulse occurs at the magnetization "null" point of the static material when the longitudinal relaxation crosses the zero point, as illustrated in FIG. 4. However, because static material has different $T_1$ values, some static material signals will remain. To the extent that these remaining signals dominate the blood signals, it is desirable to subtract them from the image. Several techniques are available for removing the static material signals through subtraction by acquiring a second image with the same static material signals as in the first image but with having different signals from blood.

For example, the same sequence as illustrated in FIG. 3 for obtaining image 1 can be repeated but with the sequence gated to the interval when the blood flow is relatively quiescent as compared to the flow during image 1. Thus, there does not occur much inflow of blood into the slab during TI. By selecting TI to be the null point of blood, blood signals in image 2 are significantly reduced. Static material signals remain the same in both images and will subract out. Moreover, by keeping TI short, less $T_1$ relaxation occurs and a larger difference signal can be detected.

Alternatively, to avoid gating to different portions of the cardiac cycle, and therefore to minimize the chances of motion related artifacts, a change in the imaging sequence must be made in a way that affects only flowing blood and not stationary material. One such change is to alter the spatial selectivity of the inverting 180° pulse for the second image. For example, by exciting with a non-selective 180° pulse, as illustrated in FIG. 5, blood flowing into the slab defined by the 90° pulse will have experienced both excitations and, assuming TI corresponds to the null point of blood or is short enough to avoid significant relaxation, will yield a different blood signal. Thus, for image 1 the original selected 180° pulse is still used. Hence, the change in the imaging parameters that differentiate flowing blood is the spatial selectivity of the 180° pulse. This subtraction approach allows for gating to the same portion of the cardiac cycle for both images, thereby minimizing the possibility of misregistration artifacts. Further minimization is possible by interleaving the measurements for both images. Either phase dependent subtraction or magnitude dependent subtraction can be employed.

Other variations are possible with the latter method for subtraction imaging. For example, it is possible to established directional sensitivity by making the 180° pulse for image 1 to be a "semi-selective" excitation whereby the slab and one adjacent region are excited, as illustrated in FIGS. 6A and 6B for the slab 21 with the excited region denoted by shading. In this case, any material flowing in from the excited region will be the same in both images and will therefore subtract out, leaving only signals which have flowed into the slab from a region on the opposite side of the slab as illustrated at 23. Alterntively, to achieve the same directional sensitivity, the spatial selectivity of the 180° pulse for the second image can by adjusted to excite the slab and the opposite side as illustrated in FIGS. 7A and 7B. In this case, material flowing in from the unexcited side can be large, but the same in both images, and will therefore cancel out. In general, to eliminate material flowing in from a particular side, the outer slab region from which it flows must experience the same exitations for both images.

After the selected 90° pulse, a spin echo may be created by applying a 180° pulse. This 180° pulse can serve a dual purpose to generate the spin echo in the slab and to invert the out of slab region if the 180° is non-selective. The two images are derived by varying the spatial selectivity of this 180° pulse. In the first case, the 180° pulse is made selective to the same slab and therefore the signal from the next 90° pulse, 180° pulse combination will contain a large blood signal as unexcited spins flow into the slab. In the second case, the 180°0 pulse is made non-selective (or less selective) creating a spin echo in the in-slab region and simultaneously inverting the spins to the out-of slab region, thus preparing the following 90° pulse, 180° pulse combination which will yield a small signal as described before. The selectivity of the 180° pulse can be alternated between measurements to interleave the two measurment sets. Gating is required if the region of interest is pulsatile flow. This method would be most useful if the heart rate is relatively fast so that the interval between a 90° pulse, 180° pulse combination is short enough to avoid a significant $T_1$ relaxation of the blood component.

The basic sequence can be modified by having the 180° inversion pulse excite only the region adjacent to the slab excited by the 90° pulse. The inversion tags that adjacent region so that any material from the tagged region flows into the slab in time for the 90° pulse to generate a signal. For the second image, the 180° pulse is simply not applied; instead, only the 90° pulse is used and the signal is quickly read out. This second image will contain a relatively large static material signal since the null point signal reduction does not apply in the system but the two static material signals cancel. The flowing material signal components will be different and thus will not cancel.

Because projection imaging is of interest, the excited slab can be imaged by 2-D techniques with spatial localization provided along the z-direction and one perpendicular direction. Since the field-of-view in the z-direction is limited by the thickness of the slab, the imaging requirements for that direction are less severe than normal. If spinwarp (2D-FT) imaging is employed, phase encoding can be applied along the same direction as slice-selection to reduce the number of measurements for the same resolution or to increase resolution with same number of measurements. Also, in contrast with other angiographic methods that rely on specific gradient waveforms to produce flow sensitivity, the method in accordance with the invention relies solely on time-of-flight effects and can therefore incorporate a wider range of gradient waveforms with which to image, including those that allow for fast imaging. The imaging gradient waveforms are best chosen however to be insensitive to motion (such as by making the first moments of the gradient zero as taught in application Ser. No. 894,318, supra) because the time-of-flight effects already provide the necessary flow sensitivity. The velocity direction sensitized by these methods is not solely along the z axis. The difference signal arises in the regions that have been flowed into by fresh spins during TI. Therefore, the regions visualized can be oriented in various directions as long as the particular region is supplied by spins from outside the slab within time TI. It is possible through to augment this sensitivity by manipulating the gradients between the first and second images. For example, if spinwarp imaging is employed, the readout gradient waveform can be varied to sensitize to flow in the direction perpendicular to z, as taught in application Ser. No. 894,318, supra.

Another useful arrangement suitable for pulsatile flow regions is to apply the 180° inversion pulse just prior to the moment of rapid flow (e.g. systole) to maximize the extent of inflow, and the 90° pulst during the period of quiescent flow (e.g.diastole) to avoid artifacts and loss of signal due to potential velocity-dependent phase shifts from the applied gradient fields.

There has been describes an improved material imaging method and apparatus in which the spatial selectivity of the excitation pulses are controlled to remove static material and generate differential signals from flowing blood. The invention has applicability to a variety of vascular regions including coronary arties, and the method is well suited for coronary artery imaging given the limited field of views required. Moreover, embodiments of the invention involving adjacent region excitation are particularly suitable because the blood feeding the arteries comes from a large well-defined region at the root of the aorta. The invention has embodiments for pulsatile and non-pulsatile conditions and it can be set up to provide one way directional sensitivity. While the resulting image represents a limited field of view, image acquisition time is reduced versus wide field of view imaging using conventional techniques, and the procedure can be repeated for other slabs to increase the field of view as required.

While the invention has been described with reference to specific embodiments, the description is illustrative of the invention and is not to be costrued as limiting the invention. Various modifications and applications may occur to those skilled in the art without departing from the true spirit and scope of the invention as defined by the appended claims.

What is claimed is:

1. A method of projection imaging moving material in a three-dimensional slab through a body using magnetic resonance techniques comprising the steps of
   (a) placing said body in a magnetic field including a first magnetic gradient (z) for slab selection,
   (b) applying a first rf pulse to said body at a frequency band and of sufficient strength to flip by a first angle nuclear spins limited essentially to said slab,
   (c) allowing moving material outside of said slab to flow into said slab,
   (d) applying at least a second rf pulse to said body at a frequency band and of sufficient strength to flip nuclear spins in said slab by a second angle suitable for generating a signal, thereby flipping nuclear spins of moving material that moves into said slab during step c,
   (e) obtaining first projection image data in an X-Z plane from said nuclesr spins flipped by said second rf pulse,
   (f) applying a third rf pulse to said body at a frequency band and of sufficient strength to flip nuclear spins in said body, including said slab but not limited to said slab by said first angle,
   (g) repeating step c,
   (h) repeating step d with a fourth rf pulse identical to said second pulse,
   (i) obtaining second projection image data in said X-Z plane from said nuclear spins flipped by said fourth rf pulse,
   (j) subtracting said first projection image data from said second projection image data to obtain a third image data of moving material moved to said slab, and
   (k) imaging said X-Z plane with said third image data.

2. The method as defined by claim 1 wherein step b further includes flippin nuclear spins on one side of said slab, and step j obtains third image data of moving material flowing into said slab from a side opposite from said one side.

3. The method as defined by claim 1 wherein said first angle is approximately 180° and said second angle is approximately 90°.

4. The method as defined by claim 3 wherein said steps (d) and h) occur when the longitudinal magnetization of excited static material is approximately zero.

5. The method as defined by claim 1 wherein step (d) includes applying a 90° rf pulse and a 180° pulse for spin echo signal detection.

6. The method as defined by claim 1 wherein steps (a) through (k) are repeated for other slabs to increase the field of view.

7. A method of imaging moving material in a slab through a body using magnetic resonance techniques comprising the steps of
   (a) placing said body in a magnetic field including a first magnetic gradient (z) for slab selection,
   (b) applying a first rf pulst to said body at a frequency band and of sufficient strength to flip by a first angle nuclear spins limited to the region on one side of said slab, (c) allowing moving material in said slab to flow from said slab and material from said one region to flow into said slab,
(d) applying a second rf pulse to said body at a frequency band and of sufficient strength to flip nuclear spins in said slab by a second angle suitable for generating a signal,
(e) obtaining first image data in an X-Z plane from said nuclear spins flipped by said second rf pulse,
(f) repeating step c without exciting said region,
(h) repeating step d,
(i) obtaining second image data in an X-Z plane in said slab from said nuclear spins flipped by the step h rf pulse,
(j) subtracting said first image data from said second image data to obtain a third image data of moving material to said slab, and
(k) imaging said third image data.

8. The method as defined by claim 7 wherein said step d) includes applying a 90° rf pulse and a 180° pulse for spin echo signal detection.

9. The method as defined by claim 7 wherein said first angle is approximately 180° and said second angle is approximately 90°.

10. The method as defined by claim 7 wherein steps (a) through (k) are repeated for other slabs to increase the field of view.

* * * * *